Feb. 7, 1967 G. R. STUTZMAN 3,302,612

PATTERN MASKS AND METHOD FOR MAKING SAME

Filed Sept. 12, 1963

INVENTOR.
Guy R. Stutzman,
BY
Paul S. Collignon Att'y.

United States Patent Office 3,302,612
Patented Feb. 7, 1967

3,302,612
PATTERN MASKS AND METHOD FOR MAKING SAME

Guy R. Stutzman, Greenwood, Ind., assignor to the United States of America as represented by the Secretary of the Navy Filed Sept. 12, 1963, Ser. No. 308,606
7 Claims. (Cl. 118—504)

The invention described herein may be manufactured and used by or for the Government of the United States of America for governmental purposes without the payment of any royalties thereon or therefor.

The present invention relates to pattern masks and a method of making pattern masks and more particularly to masks that are to be used in a deposition process of making thin film circuitry.

There is a constant demand for smaller electrical and electronic components, particularly in the aircraft and missile fields, as weight is of extreme importance. One concept of microelectronics which offers a great reduction in size and weight of electronic units is that of integrated circuitry which is formed on insulated bases. Integrated circuitry includes a number of active and passive components which are fabricated by one or more of a combination of several thin film deposition techniques onto a substrate.

The substrate can be of any suitable material, such as glass, alumina, beryllia, or barium titanate. The present state of the art of thin-film microcircuitry fabrication permits the deposition of resistors, capacitors, small inductances, and connectors. This solid film can be deposited onto substrates by various methods such as electrodeposition, chemical precipitation, thermal decomposition, cathodic sputtering, and high vacuum evaporation. The depositing of films by high vacuum evaporation has been particularly successful as the process is easily controlled, and the deposited films have a high degree of purity.

The capacitance of a thin-film condenser is a function of the areas of the capacitor electrodes. The resistance of a thin-film resistor is a function of the resistor length and width. The interconnection of microcircuit components requires the deposition of conducting materials on accurately located areas of the substrate. It can thus be seen that the successful production of passive thin-film microcircuitry is largely dependent upon the ability to deposit desired materials at accurately defined areas on a substrate.

As the size of the areas of the active and passive components which are deposited on the substrates must be very exact, the design of the mask that governs the pattern of the components is critical. Heretofore, one well-known type of mask employed in the making of integrated circuitry components consisted of a very thin metallic plate which has been pierced or etched to provide a plurality of apertures of desired configuration. One such mask is shown and described in U.S. Patent 3,061,476, entitled, "Method of Making Thermistor Bolometers," which was issued October 30, 1962, to Henry F. Miserocchi. The mask described in the Miserocchi patent has a thickness between 10 and 100 microns and is formed of metal or a plastic material such as "Mylar." In operation, the thin mask is secured to a backing block by a gripping bar and a pair of C-clamps.

While very thin metallic and plastic masks are suitable for some applications, their use is severely limited whenever high temperature deposition is used, as the thin masks buckle and distort. In the present invention, the mask is made of graphite with a central area being a thin-walled section in which the pattern is cut. As the coefficient of thermal expansion of graphite is very low, heat will not distort the mask and also graphite is not affected by any of the etchants that are normally employed to remove the materials that build up on the mask. A thin metallic coating is deposited onto the side of the mask that comes into contact with the substrate.

It is therefore a general object of the present invention to provide an improved mask for use in making integrated circuitry by a thin film deposition technique, and by providing an improved method of making the mask.

Another object of the present invention is to provide an improved method of making a pattern mask having a relatively thin section that will not buckle or warp when subjected to elevated temperatures.

Other objects and advantages of the present invention will be readily appreciated as the same becomes better understood by reference to the following detailed description when considered in connection with the accompanying drawing wherein.

Figures 1, 2, 3, 4, 5, 6, 7:
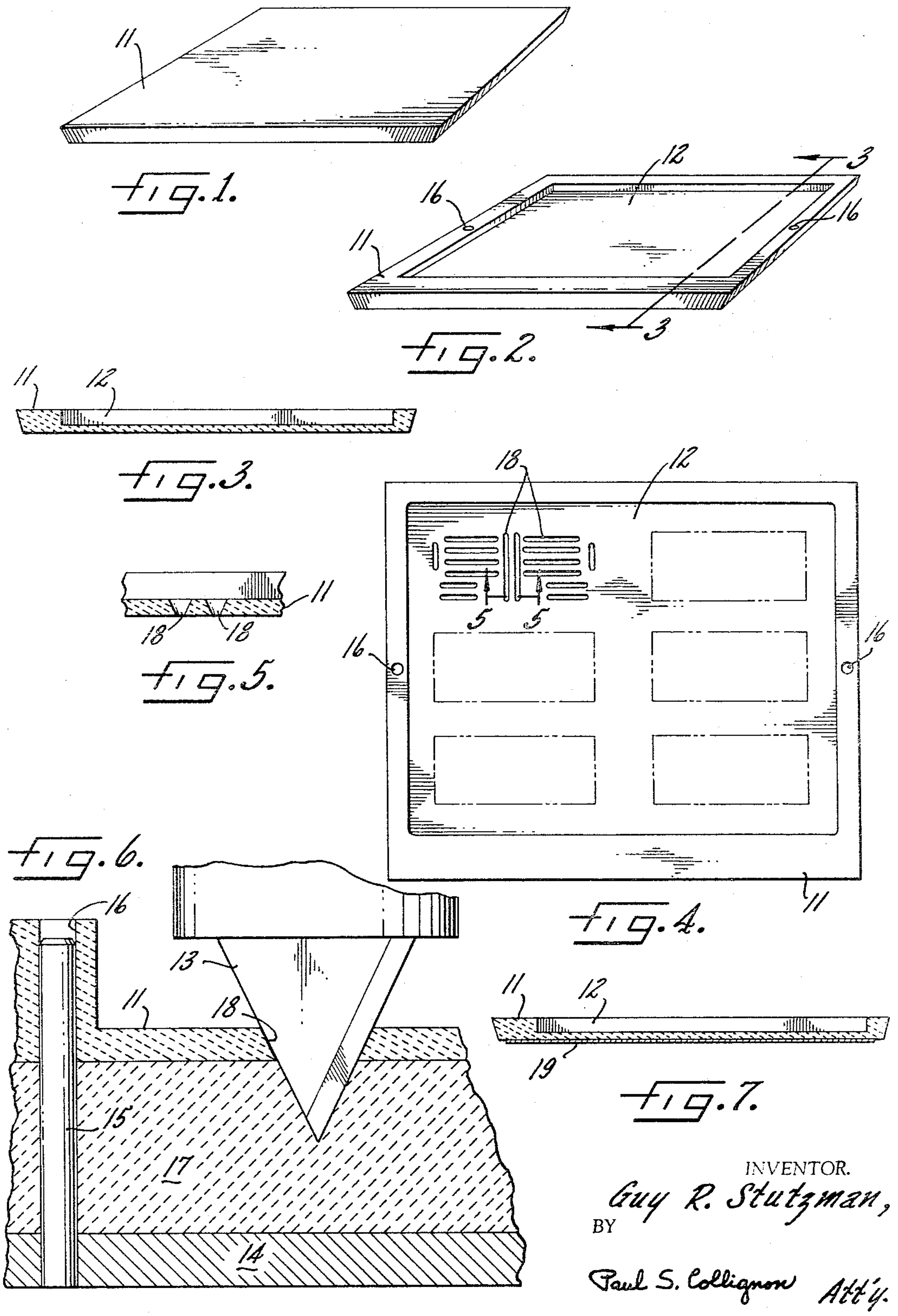
FIGURE 1 is a perspective view showing a graphite blank to be used in making a mask.
FIGURE 2 is a perspective view showing a graphite blank having a membrane section.
FIGURE 3 is a sectional view taken on line 3—3 of FIGURE 2.
FIGURE 4 is a top view of a graphite plate showing a plurality of patterns therein.
FIGURE 5 is a sectional view taken on line 5—5 of FIGURE 4.
FIGURE 6 is a partial sectional view showing the cutting of a pattern in a graphite blank.
FIGURE 7 is a sectional view showing plating on a completed mask.

Referring now to the drawing, a graphite blank 11 is formed or cut to a desired size and provided with tapered sides in order to facilitate mounting in a holding fixture in a deposition chamber. As shown in FIGURES 2 and 3 of the drawing, a portion of material is removed from a large central area to form a membrane area 12. By way of example, the thickness of graphite blank 11 might be about ¼ inch with the thickness of the membrane area being about .050 inch.

Referring now to FIGURES 4, 5, and 6, of the drawing, a pattern is cut into the membrane area 12 by a rotating tapered tool 13. As best shown in FIGURE 6, graphite blank 11 is positioned on fixture 14 by means of pins 15 that engage holes 16 in blank 11. A graphite back-up plate 17 supports blank 11 and prevents chipping or breaking of the edges during cutting. By way of example, cutting tool 13 might have a 30 degree angle on its point, and the width of the slot 18 that is cut into the membrane area 12 is directly proportional to the depth of cut. The resulting slots, which are tapered, facilitate deposition of vapors onto a substrate as the slots provide a funnel effect. The mask that is shown in FIGURE 4 of the drawing has six identical patterns cut therein so that six substances can be processed at the same time. Naturally a greater or lesser number of patterns could be provided without departing from the scope of the invention.

After the patterns are cut into membrane area 12, a thin coating of metal 19 is deposited onto the side of the mask that comes into contact with the substrates, that is, the side opposite the side from which graphite was removed is plated. The deposited metal prevents graphite dust from rubbing off when the pattern mask comes into contact with substrates being processed, and also the thin layer of metal helps support the thin edges of the tapered slots and prevents chipping. By way of example, a 4 micron layer of aluminum which has been vacuum deposited onto the top surface of the pattern mask provides a very adequate coating, however, other metallic coatings such as chromium, copper, gold, nickel, platinum, silver, and tin will also provide adequate coatings.

Obviously many modifications and variations of the present invention are possible in the light of the above teachings. For example, it would be possible to mold the graphite blanks having a membrane section whereby the next step in manufacture would be the cutting of the pattern. It is therefore to be understood, that within the scope of the appended claims, the invention may be practiced otherwise than as specifically described.

What is claimed is:

1. The method of making a thin film pattern mask comprising,
   producing a graphite mask blank having a thin membrane area surrounded by heavier wall sections,
   then cutting a pattern through said membrane area, and
   then depositing a metallic coating on one side of said graphite plate.

2. The method of making a thin film pattern mask comprising,
   first removing from an area of a flat graphite plate a portion of its thickness thereby forming a thin membrane area,
   next cutting a pattern through said membrane area, and
   then depositing a metallic coating on one side of said graphite plate.

3. The method of making a thin film pattern mask as set forth in claim 2 wherein said metallic coating is deposited on said graphite plate on the side opposite the side from which graphite was removed.

4. The method of making a thin film pattern mask as set forth in claim 2 wherein said pattern is cut through said membrane area with a rotating tapered tool whereby the width of said pattern is proportional to the depth of cut.

5. The method of making a thin film pattern mask as set forth in claim 4 wherein said cut is made through from said side from which graphite was removed.

6. The method of making a thin film pattern mask comprising,
   first removing from an area of a flat graphite plate a portion of its thickness thereby forming a thin membrane area,
   then positioning said flat graphite plate atop a graphite back-up plate,
   then cutting a pattern through said membrane area with a rotating tapered tool whereby the width of said pattern is proportional to the depth of cut, and
   then depositing a metallic coating on said flat graphite plate on the side opposite the side from which graphite was removed.

7. A thin film pattern mask comprising,
   a plate of graphite having a thin membrane section surrounded by a wall section,
   at least one group of slots cut through said membrane section, and
   a thin metallic coating on the side of said plate opposite said wall section.

References Cited by the Examiner

UNITED STATES PATENTS

| | | | |
|---|---|---|---|
| 2,979,024 | 4/1961 | Pellekaan | 117—212 X |
| 3,088,435 | 5/1963 | Wolff | 118—504 |

ALFRED L. LEAVITT, *Primary Examiner.*

J. R. BATTEN, JR., *Assistant Examiner.*